US006632584B1

(12) United States Patent
Morgan

(10) Patent No.: US 6,632,584 B1
(45) Date of Patent: Oct. 14, 2003

(54) LASER-IMAGEABLE PRINTING MEMBERS AND METHODS FOR WET LITHOGRAPHIC PRINTING

(75) Inventor: David A. Morgan, Stillwater, MN (US)

(73) Assignee: Creo, Inc. (CA)

( * ) Notice: Subject to any disclaimer, the term of this patent is extended or adjusted under 35 U.S.C. 154(b) by 0 days.

(21) Appl. No.: 09/657,826

(22) Filed: Sep. 8, 2000

Related U.S. Application Data

(63) Continuation-in-part of application No. 09/411,962, filed on Oct. 4, 1999, now abandoned.

(51) Int. Cl.[7] ............................ G03C 1/74; G03C 1/76; G03C 1/77; G03C 1/735; G03F 7/038; G03F 7/20

(52) U.S. Cl. ................................ 430/271.1; 430/275.1; 430/278.1; 430/302; 430/945; 101/456; 101/457; 101/458; 101/459

(58) Field of Search ........................... 430/271.1, 275.1, 430/278.1, 281.1, 300, 302, 945; 101/456, 457, 458, 459

(56) References Cited

U.S. PATENT DOCUMENTS

| | | | | | |
|---|---|---|---|---|---|
| 3,589,289 | A | | 6/1971 | Gosnell et al. | 101/401.1 |
| 4,034,183 | A | * | 7/1977 | Uhlig | 219/121.85 |
| 4,380,196 | A | * | 4/1983 | Kato et al. | 101/453 |
| 4,693,958 | A | * | 9/1987 | Schwartz et al. | 430/302 |
| 5,493,971 | A | | 2/1996 | Lewis et al. | 101/454 |
| 5,609,671 | A | | 3/1997 | Nagasawa | 106/31.65 |
| 5,746,818 | A | | 5/1998 | Yatake | 106/31.86 |

* cited by examiner

*Primary Examiner*—Janet Baxter
*Assistant Examiner*—Sin J. Lee
(74) *Attorney, Agent, or Firm*—Madson & Metcalf

(57) ABSTRACT

A thermosensitive composition consisting of a mixture of polyacrylic acid, a salt of a long chain fatty acid such as silver behenate, an infra-red absorbent and modifiers such as additional polymers and fillers. Both the water solubility and affinity to water and oil changed when composition is heated.

27 Claims, No Drawings

LASER-IMAGEABLE PRINTING MEMBERS AND METHODS FOR WET LITHOGRAPHIC PRINTING

RELATED APPLICATIONS

This application is a continuation-in-part of U.S. patent application Ser. No. 09/411,962, filed on Oct. 4, 1999 now abandoned.

BACKGROUND OF THE INVENTION

1. Field of the Invention

The invention relates to thermally alterable compositions and more specifically to coatings which can be switched by imagewise exposure to heat-convertible radiation from a hydrophilic state to a hydrophobic state, especially using a focused infra-red (IR) laser. A main application is lithographic printing masters.

2. Background of the Invention

There is continuing interest in monochrome image-forming media suitable for address by lasers, particularly media requiring no processing subsequent to the laser exposure ('direct write' media), or requiring only uniform thermal processing to develop the image. Such media do not generate waste materials (e.g., in the form of processing solutions, used donor sheets, strippable cover sheets, and the like) which may present a disposal problem, and are the most convenient media from the user's point of view.

Two main areas of utility for such monochrome image-forming media are graphic arts films and medical imaging films and papers, which generally impose differing requirements on the imaging media. Graphic arts films are normally used to provide a contact mask for subsequent UV flood-exposure of a printing plate or proofing element. For this reason, they should have a high contrast, strong absorption in the UV in image areas, and high UV transparency in the background areas. The visual appearance (tone) of the graphic arts image is less important. On the other hand, medical imaging media are used to record on film or paper the output of digital radiography equipment, CAT scanners, magnetic resonance scanners, ultrasound scanners etc. To facilitate inspection and interpretation of the images by the human eye, continuous tone images with a neutral black appearance are required, preferably with a high Dmax capability e.g., greater than 3.0).

In view of these contradictory requirements, different types of imaging media have been proposed for the different applications. For example, the high contrast requirements of graphic arts media are most easily met by methods such as mass transfer, ablation transfer or peel-apart systems, as described in U.S. Pat. Nos. 3,962,513, 5,171,650, 5,352,562, 4,981,765 and 5,262,275, EP-A-0465727 and EP-A-0488530, and International Patent Applications Nos. WO90/12342, WO93/04411, WO93/03928 and WO88/04237. Such methods generally involve the disposal of at least one donor sheet or cover sheet, and are inherently incapable of continuous tone imaging.

Continuous tone imaging requires that image density be produced in proportion to the exposure energy received. Systems which meet this requirement include dye diffusion (or sublimation) transfer, and systems described in U.S. Pat. Nos. 4,826,976, 4,720,449, 4,960,901, 4,745,046, 4,602,263 and 4,720,450 wherein dyes (yellow, magenta or cyan) are created or destroyed in response to heat generated by laser exposure. These systems do not easily produce a neutral black colour or a high Dmax. Consequently, for medical imaging the main emphasis has been on systems involving the reduction of metal salts, especially silver salts, to the corresponding free metal.

Silver-based imaging elements that can be imagewise exposed by means of light or heat are well known. Silver halide conventional photographic and photothermographic elements are the most representative elements of the class of light-sensitive materials. In both conventional photographic ('wet silver') and photothermographic ('dry silver') elements, exposure of the silver halide in the photosensitive emulsion to light produces small clusters of silver atoms ($Ag^{O}$). The imagewise distribution of these clusters is known in the art as a latent image. Generally, the latent image formed is not visible by ordinary means and the photosensitive emulsion must be further processed to produce a visible image. In both dry and wet silver systems the visible image is produced by the reduction of silver ions which are in catalytic proximity to silver halide grains bearing the clusters of silver atoms, i.e., the latent image. This produces a black and white image.

Conventional photographic silver halide elements require a wet development process to render the latent image visible. The wet chemistry used in this process requires special handling and disposal of the spent chemistry. The process equipment is large and requires special plumbing.

In photothermographic elements, the photographic silver halide is in catalytic proximity to a non-photosensitive, reducible silver source (e.g., silver behenate) so that when silver nuclei are generated by light exposure of the silver halide, those nuclei are able to catalyze the reduction of the reducible silver source. The latent image is amplified and rendered visible by application of uniform heat across the element.

U.S. Pat. No. 5,041,369 describes a process that capitalizes on the advantage of a dry processed photothermographic element without the need for surface contact with a heating device. The photothermographic element is imagewise exposed with a laser which splits the beam using a second harmonic generation device. In this process, the element is simultaneously exposed with one wavelength of light and thermally activated by the second wavelength of light. Even though this process has the advantage of simultaneous exposure and heat development of the image, the equipment is complex and limited by laser outputs capable of generating two useful separate wavelengths.

Photosensitive emulsions which contain silver halide are well known in the art to be capable of causing high minimum density (Dmin) in both the visible and ultraviolet (UV) portions of the spectrum. The high UV Dmin is due to the inherent absorption in the near UV of silver halides, particularly silver bromide and silver iodide, and to high haze when silver halide and organic silver salts are present together. High UV Dmin is undesirable for graphic arts scanner and imagesetting films since it increases the exposure time required during contact exposure with other media such as UV printing plates, proofing films etc. High haze can also lead to loss of image resolution when imaged photothermographic elements are used as contact films. It is also well known that imaged photothermographic elements comprising silver halides are prone to unwanted build up of Dmin in the background areas, especially on prolonged exposure to light.

Closely related to the above-described photothermographic media are the materials described in U.S. Pat. No. 5,260,180, which discloses thermally imageable compositions comprising a silver salt of an organic acid, a reducing agent, and, optionally, an activator, coated together in a suitable binder, which can be rendered photoimageable by the addition of a tetrahydrocarbylborate salt. The compositions develop a black silver image when subjected to imagewise light exposure and uniform thermal development. It is believed that a portion of the silver salt is converted to the silver tetrahydrocarbylborate, which forms catalytic $Ag^{O}$ cluster's in response to light exposure. When a suitable sensitising dye is present, a laser may be used for the imagewise exposure.

Thermographic elements are a class of imaging elements that do not rely on silver halide based chemistry. They are commonly used in labels, tickets, charts for recording the output of medical or scientific monitoring apparatus, facsimile paper, and the like. In their most common form, thermographic elements comprise a support carrying a coating of a thermally-sensitive composition comprising a colour former and a developer which react together to generate image density on application of heat. Examples of colour formers include leuco dyes which may be oxidised to the corresponding coloured dyes by suitable developing agents. Mixtures of leuco dyes may give rise to a black image, but an alternative route to a black image is the thermal reduction (to the free metal) of a light-insensitive metal salt of an organic acid (especially a silver salt such as silver behenate) by means of a suitable reducing agent.

Conventionally, heat has been applied imagewise to thermographic elements by thermal print heads, thermal styli and the like. However, in recent years such materials have been adapted for laser address by incorporating in the thermosensitive coating one or more infrared (IR) absorbers. These compounds can absorb the output of IR lasers and thus generate heat in irradiated areas which triggers the thermographic chemistry. For example, U.S. Pat. No. 5,196,297 discloses recording materials which employ colour-forming di- and tri-arylmethane compounds possessing certain S-containing ring-closing moieties and a Lewis acid material capable of opening said moieties. The preferred Lewis acid is a silver salt such as silver behenate, which converts the colour-forming compounds to their coloured form under the action of heat. In some embodiments, the heat is supplied via absorption of laser radiation by an IR dye.

In the field of black and white imaging, EP-A-0,582,144 discloses a thermal recording material comprising a substrate coated with an imaging system, the imaging system containing (a) a thermally reducible source of silver, (b) a reducing agent for silver ion, (c) a dye which absorbs in the range 500–1100 nm, and (d) a polymeric binder. The material gives a black image in response to laser address without need for further processing, but the scan rates and dwell times quoted are impractically slow, e.g., 15 cm/sec and tens or hundreds of milliseconds respectively. Similarly, EP-A-0,599,369 discloses a recording material comprising a support and at least one imaging layer containing uniformly dispersed in a polymeric binder (1) a substantially light-insensitive silver salt in working relationship with (2) at least one organic reducing agent, characterized in that said organic reducing agent is a polyhydroxy spiro-bis-indane. In some embodiments, an IR absorber is also present and imaging is by laser address, but in the example given, a Dmax of only 0.47 was obtained and the writing time for an A3-sized image was 24 minutes. The imaging materials disclosed in both these patents are of the direct-write type, in which the image density is generated at the moment of laser exposure, and there is no capability for amplification via post-exposure processing.

EP-A-0,582,144 discloses placement of reducing agent in the same layer as the silver salt, whereas EP-A-0,599,369 discloses that placement of reducing agent in a separate layer is also possible, although no advantage is cited for this configuration, and indeed the Examples disclose only single-layer constructions. This accords with conventional wisdom regarding direct-write media imageable by laser address, where the generation of an adequate image density at a realistic scan rate is seen as the major problem to be overcome. Requiring the reducing agent to migrate from one layer to another before imaging can take place would be expected to increase the energy demand, and hence lower the writing speed.

WO95/07822 discloses imaging materials broadly similar to those of EP-A-0,599,369, except that additional restrictions are placed on the absorption spectrum of the IR absorber (in the interests of improved UV and visible transparency), and a wider range of reducing agents are described.

None of EP-A-0,582,144, EP-A-0,599,369 and WO95/07822 teaches any particular importance for the selection of the binders used, and all three recite a wide variety of polymers as being suitable. However, in the Examples of all these publications, polyvinyl butyral) is the only binder material disclosed for the silver-containing layers. Poly (vinyl butyral) has a glass transition temperature (Tg) of about 50°–56° C.

U.S. Pat. No. 5,766,828 describes an IR laser addressable imaging element comprising: a substrate; a first layer comprising a reducible light-insensitive silver salt and a binder; and a second layer comprising an infrared absorber, a reducing agent for said silver salt and a binder; characterised in that the binder of said first layer is a polymeric medium having a glass transition temperature of at least 80° C. Imaging elements are of the single sheet type, in which a single support sheet carries all the component layers. Apart from an optional heat treatment, no processing steps (such as wet development, peeling apart etc.) are required subsequent to laser imaging for the purposes of developing or fixing the image. The invention asserts that two-layer direct-write media are capable of high sensitivity, and that the two-layer configuration enables post-exposure thermal amplification of the image (which further enhances the sensitivity) and continuous tone imaging, neither of which is described in the prior art. Furthermore, the performance improves with increasing binder Tg which is contrary to expectations. The invention further extends to imaging methods employing such elements, comprising the steps of: 1) image-wise irradiating the element with IR laser radiation of sufficient intensity so as to generate a latent image of silver specks having a $D_{max}$ of less than 1.0, and 2) heating the element to produce a visible image having a $D_{max}$ of at least 2.5. This produces a monochrome silver metal image in response to laser irradiation, either directly or after uniform thermal processing.

BRIEF DESCRIPTION OF THE INVENTION

A chemical composition according to the invention is capable of switching from a hydrophilic state to a hydrophobic state when heated, preferably by a focused IR laser. This composition also changes from a more water-soluble to a less soluble composition when heated. The degree of solubility and the degree of hydrophilic activity can be controlled over a wide range by mixing the composition with different polymers. Such compositions are of great commercial importance in the field of lithographic offset printing, which is based on the fact that the hydrophilic areas of an image will not carry ink. The making of lithographic printing masters is well known, however most lithographic masters require processing after exposure. The current invention allows lithographic masters, such as printing plates, to be used immediately after exposure without requiring any chemical development. The invention also enables the use of the composition to coat printing cylinders directly and image them on the printing press. Prior art thermosensitive composition based on physical effects (melting) or different reaction do not produce as sharp a switch of properties as the present invention. In this disclosure the term "water solubility" refers not only to true solubility but to the ability to be washed away by water or water-based solutions (aqueous solutions with or without organic solvents, alkaline agents, surfactants, etc.), even if the removal mechanism is based on effects other than true solubility in pure water. Other physical effects and phenomena such as softening, swelling, lifting and the like that assist in the differential removability of the layer after thermal exposure are included in the term "solubility".

In accordance with the invention, a water-soluble polymer is made to react with a metallic salt of a long chain fatty acid. As long as the mixture is not heated it is hydrophilic due to the water-soluble polymer. After heating, the water-soluble polymer reacts with the metallic salt to form a highly hydrophobic and insoluble polymer. While it is believed to be the nature of the reaction the invention should not be constrained by any explanation used in the disclosure. In order to make the composition compatible with imagewise heating using lasers, an absorber for the specific laser wavelength used has to be added. Absorbers can be broadband (covering a wide range of wavelengths) such as carbon powder or dyes tuned to a specific laser wavelength, such as IR absorbing dyes tuned to laser diodes.

In the most basic form the invention contains only these three ingredients (water soluble polymer, salt of fatty acid and laser absorber). In this form the unexposed areas are both hydrophilic and highly water-soluble. After heating with a laser, the exposed areas become highly hydrophobic and insoluble. In this form the invention is useful for making lithographic printing plates by coating a lithographic metal, such as anodized aluminum, with the composition. The unexposed areas are washed away and the exposed metal repels ink by carrying water.

A more useful form of the invention results when additional polymers and fillers are introduced to control the solubility of the unexposed areas without degrading the basic switch from hydrophilic to hydrophobic. For example, if a sufficient amount of polyvinyl butyral is added the unexposed areas are hydrophilic but not easily soluble, thus a printing master which does not rely on lithographic metal is created. Such a printing master has major advantages for making low lost lithographic plates. It can be coated on almost any substrate including re-usable lithographic masters, as old coating can be washed off after printing and a new coating applied without particular concern for contamination remaining on the substrate. Such material are also known as "surface switchable polymers" or "switchable polymers". An example of such a polymer is given in U.S. Pat. No. 4,081,572.

DETAILED DESCRIPTION OF THE INVENTION

A thermosensitive composition switching from a water-soluble hydrophilic state to an insoluble hydrophobic state is based on the reaction between a water-soluble polymer and a metallic salt of a long chained fatty acid. The length of carbon chain of the fatty acid is critical. Short fatty acid salts are too reactive, and will react with the water-soluble polymer at room temperature. Very long fatty acids will not react at all. The invention requires a composition that has a long shelf life at room temperature (up to years) while reacting in a few millionth of a second at temperatures of a few hundred ° C. The requirement for very fast reaction time at elevated temperatures stems from the need to imagewise exposed a thin layer of the composition using a focused laser beam. The small size of the laser beam, typically 2–20 microns, causes the dwell time of the beam on any given spot to be extremely brief, in the range of 1–10 microseconds. It was found out that only fatty acids with a carbon chain length from about 18–24 carbon atoms perform well. The rate of reaction at a given temperature can also be modified by the molecular weight of the water-soluble polymer as well as by adding other polymers to the composition. The ratio of the ingredients also affects the rate of the reaction. These effects are secondary compared to the dominant effect of the carbon chain length of the fatty acid. Light-insensitive silver salts are materials which, in the presence of a reducing agent, undergo reduction to silver metal at elevated temperatures, typically in the range 60°–225° C. Preferably, these materials are silver salts of long chain alkanoic acids (also known as long chain aliphatic carboxylic acids or fatty acids) containing 10 to 30 carbon atoms; more preferably 10 to 28 carbon atoms, and most preferably 10 to 22 carbon atoms. These salts are also known as 'silver soaps'. Non-limiting examples of silver soaps include silver behenate, silver stearate, silver oleate, silver erucate, silver laurate, silver caproate, silver myristate, silver palmitate, silver maleate, silver fumarate, silver tartarate, silver linoleate, silver camphorate, and mixtures thereof. It should be emphasized that the presence of silver salts which are intrinsically light-sensitive, such as silver halides and silver organoborates, is not required or even desirable. Likewise, the presence of compounds capable of reacting with the light-insensitive silver salt to form silver halides or silver organoborates is not preferred. Systems free of light sensitive silver salts such as silver halides and silver organoborates are therefore preferred.

One aspect of the present invention comprises a positive working wet printing member imageable by laser radiation, the member comprising:

(a) an ink-accepting surface layer comprising one or more polymers and a sensitizer, said sensitizer being characterized by absorption of said layer radiation and said surface layer being characterized by ablative absorption of said laser radiation;

(b) a hydrophilic layer underlying said surface layer, said hydrophilic layer comprising one or more polymers and being characterized by the absence of ablative absorption of said laser radiation, particularly at levels that are 25% higher than the minimal radiation level at which ablation will occur on layer (A); and (c) a hydrophilic metal substrate;

wherein said surface layer comprises one or more materials selected from the group consisting of metal salts of organic acids.

Another aspect of the present invention comprises a negative working wet printing member imageable by laser radiation, the member comprising:

(a) hydrophilic surface layer comprising one or more polymers and a sensitizer, said sensitizer being characterized by absorption of said laser radiation and said surface layer being characterized by non-ablative absorption of said laser radiation;

(b) a substrate underlying said surface layer;

wherein said surface layer comprises metal salts of organic acids, and poly(meth)acryloyl polymer binder.

The metal of the metal salts preferably comprises silver or copper. The metal salts my preferably comprises a salt of a sulfamide, such as a sulfadiazine. A laser imaged lithographic printing master may comprise a dimensionally stable substrate coated with a thin layer of the composition of this invention, also containing an absorber for absorbing radiation of said laser. The member of this invention is preferred where the one or more polymers comprise at least one acrylic polymer. The member is preferred where the metal salt is selected from the group consisting of metal salts of sulfamide, sulfanylamide, acetosulfamine, sulfapyridine, sulfaguanidine, sulfamethoxazole, sulfathiazole, sulfadiazine, sulfamerazine, sulfamethazine, sulfaisoxazole, homosulfamine, sulfisomidine, sulfaguanidine, sulfamethizole, sulfapyradine, phthalisosulfathiazole, and succinylsulfathiazole. The metal slats are preferred where the metal of the metal salt comprises silver or copper.

The best results were obtained by using acryloyl, (including methacryloyl) compositions, such as polyacrylic acid as the water-soluble polymer and silver soaps or copper soaps (such as silver behenate or copper behenate) as the metallic salt of the fatty acid, with polyvinylbutryal as a modifying polymer. The modifying polymer controls the degree of water solubility of unexposed areas. The phrase "water solubility" does not only refer to solubility in pure water but in many aqueous solutions, as long as they are not sufficiently active to change the composition. By way of example, "water solubility" in the context of printing plates should be interpreted as solubility in the water fountain solution used on a lithographic press, which contains small amounts of acid, gum and other ingredients in the water. This phrase also refers to the solubility in aqueous developers, typically alkaline solutions. As the case is for any solvent, the solubility is also strongly affected by temperature.

Another unique property of the present invention, particularly where the polymer system comprises an acrylic polymer, is the fact that the continuing exposure of the imaged plate to water allows the residual polymeric material to harden during use, without necessarily significantly affecting the hydrophilicity of the composition. This is a unique attribute in view of the fact that many print jobs require the formation of large numbers of copies. As these compositions harden with usage, the life of these compositions tends to be lengthened at that period during printing when the quality of the image is at its highest, after the initial copies have been made.

The uniqueness of the invention lies in the very sharp switching of the surface properties found in this reaction and the greater versatility of the reaction due to its high tolerance to additives. This high tolerance allows the user to tailor the properties of the composition by adding relatively large amounts of other polymers and fillers such as clay, pigments, absorbers, etc. Surfactants and adhesion promoters can be added as well without affecting the reaction. In the following examples the solvent used is ethanol, but other solvents can be used as well. The solvent fully evaporates after application of the composition, thus is not part of the reaction. Different solvents, such as ethanol/water mixes or pure water can be used. In most applications, the composition is applied by roller coating, knife coating or spraying to a thickness of 1–10 microns. In order to absorb sufficient amounts of laser power in such a thin layer, a strong absorber is required, as the composition is non-absorbent in the visible or IR part of the spectrum. Many dyes and pigments were tested and the composition works with all of them. Imaging elements in accordance with the invention further comprise an IR absorber. Preferred IR absorbers are dyes or pigments absorbing strongly in the range 700–1200 nm, preferably 750–1100 nm, but having minimal absorption in the range 380–700 nm (i.e., the near UV and visible region). Any of the dye classes commonly used in laser-addressable thermal imaging media may be suitable for use in the present invention, such as cyanines, merocyanines, amine cation radical dyes, squarylium dyes, croconium dyes, tetra-arylpolymethine dyes, oxonols etc. Factors affecting the choice of dye include thermal stability, light-fastness, compatibility with other ingredients, and solubility in suitable coating solvents. Preferred classes of IR dye include squarylium, croconium, amine cation radical, and tetraarylpolymethine. Particularly preferred dyes are of the type disclosed in U.S. Pat. No. 5,360,694. The best performing absorbers for the near IR were IR dye ADS830 made by American Dye Source (N.J.); Lamplack Carbon Powder from Fisher Scientific Supplies and WS830 from Zenica (U.K.), which is a water soluble IR dye. In all the following examples the work "IR Absorber" should be interpreted as one of these absorbers. The invention, of course, is not limited to any absorber and works well even without an absorbent if the heat is applied directly by conduction or convention instead of by radiation. By the way of example, the composition can be used without an absorbent if it is coated onto a substrate which absorbs the laser radiation, heating up the coated layer by conduction. Another application where an absorber is not required is when the heat is applied by an array of resistive elements, similar to thermographic paper.

A wide variety of reducing agents for silver ion can be used in the invention, including mixtures of reducing agents, such materials being well-known to those skilled in the art. Examples include, but are not limited to, esters of gallic acid (such as methyl gallate, butyl gallate etc), hindered phenols (such as 2,2'-alkylidenebisphenols), polyhydroxybenzenes (such as hydroquinone, catechol, etc.), ascorbic acid, 1,4-dihydropyridines (such as 3,5-dialkoxycarbonyl-2,6-dialkyl-1,4-dihydropyridines) and the like. Preferred reducing agents for use in the invention are methyl gallate, propyl gallate, 2,2'-methylenebis(4-methyl-6-t-butylphenol), and mixtures thereof. A wide range of reducing agents has been disclosed in dry silver systems including amidoximes such as phenylamidoxime, 2-thienylamidoxime and p-phenoxyphenylamidoxime, azines (e.g., 4-hydroxy-3,5-dimethoxybenzaldehydeazine); a combination of aliphatic carboxylic acid aryl hydrazides and ascorbic acid, such as 2,2'-bis(hydroxymethyl)propionylbetaphenyl hydrazide in combination with ascorbic acid; a combination of polyhydroxybenzene and hydroxylamine, a reductone and/or a hydrazine, e.g., a combination of hydroquinone and bis(ethoxyethyl)hydroxylamine, piperidinohexose reductone or formyl-4-methylphenylhydrazine, hydroxamic acids such as phenylhydroxamic acid, p-hydroxyphenylhydroxamic acid, and o-alaninehydroxamic acid; a combination of azines and sulfonamidophenols, e.g., phenothiazine and 2,6-dichloro-4-benzenesulfonamidophenol; alpha.-cyanophenylacetic acid derivatives such as ethyl .alpha.-cyano-2-methylphenylacetate, ethyl alpha.-cyano-phenylacetate; bis-o-naphthols as illustrated by 2,2'-dihydroxyl-1-binaphthyl, 6,6'dibromo-2,2'-dihydroxy-1,1'-binaphthyl, and bis(2-hydroxy-1-naphthyl)metthane; a combination of bis-o-naphthol and a 1,3-dihydroxybenzene derivative, (e.g., 2,4-dihydroxybenzophenone or 2,4-dihydroxyacetophenone); 5-pyrazolones such as 3-methyl-1-phenyl-5-pyrazolone; reductones as illustrated by dimethylaminohexose reductone, anhydrodihydroaminohexose reductone, and anhydrodihydropiperidone-hexose reductone; sulfamidophenol reducing agents such as 2,6-dichloro-4-benzenesulfonamidophenol, and p-benzenesulfonamidophenol; 2-phenylindane-1,3-dione and the like; chromans such as 2,2-dimethyl-7-t-butyl-6-hydroxychroman; 1,4-dihydropyridines such as 2,6-dimethoxy-3,5-dicarbethoxy-1,4-dihydropyridine; bisphenols, e.g., bis(2-hydroxy-3-t-butyl-5-methylphenyl) methane; 2,2-bis(4-hydroxy-3-methylphenyl)propane; 4,4-ethylidene-bis(2-t-butyl-6-methylphenol); and 2,2-bis(3,5-dimethyl-4-hydroxyphenyl)propane; ascorbic acid derivatives, e.g., 1-ascorbylpalmitate, ascorbylstearate and unsaturated aldehydes and ketones; 3-pyrazolidones; and certain indane-1,3-diones.

The reducing agent should be present as 1 to 10% by weight of the imaging layer. In multilayer constructions, if the reducing agent is added to a layer other than an emulsion layer, slightly higher proportions, of from about 2 to 15%, tend to be more desirable.

The composition can be coated on any substrate providing sufficient dimensional stability and adhesion. Of particular importance are lithographic printing plates created by coating the composition onto the following substrates: aluminum, steel, polyester, lithographic aluminum (which is grained and anodized aluminum), waterproof paper and aluminum foil clad paper.

The versatility of the invention is illustrated by the following examples. As is the case for all thermosensitive compositions, it is sometimes desired to add an indicator dye permanently changing color with temperature, to generate a visible image of the imagewise exposed areas. One manner of creating a more visible image using the present invention is the use of a reducing agent to reduce the silver behenate to metallic silver, creating a dark image of the exposed areas. Such reduction of silver behenate to produce a visible image is disclosed in U.S. Pat. Nos. 3,168,864 and 3,103,881 and need not be detailed here. Note that while these prior art compositions use silver behenate, they use it to form the visible image and not as the key for the hydrophilic to hydrophobic switching.

The compositions of the present invention may be used in combination with all of the additives generally used in the thermographic and photohermographic art for the modification of the compositions for both physical and functional properties. Fillers, lubricants, antistatic agents, UV absorbers to stabilize the composition, antioxidants, colorants, leuco dyes, slip agents, roughening agents, and the like may be added at the design of the user.

Example 1A–1B

A dry sample of silver behenate is mixed with ethanol and a 7% solution of polyacrylic acid. It is a ball milled for eight hours using 12 mm balls. If carbon absorber is used (example 1A), it is mixed with the above ingredients before ball milling. If an IR dye is used (example 1B), it is mixed only after ball milling due to the short shelf life of the IR dye. The quantities are as follows:

3 grams silver behenate (available from Aveka Inc. Woodbury, Minn.)

1 gram polyacrylic acid (14.3 grams of 7% solution, available from Scientific Polymer Products, New York)

Note: the polyacrylic acid has a typical molecular weight of 450,000.

1 gram absorber (carbon in example 1A or ADS830 in example 1B)

24 gram ethanol

The liquid is spread on lithographic aluminum (available from any printing plate supplier, such as City Plate, N.Y.) using a knife coater to dry thickness of about 1.5 microns. It is exposed with a Creo Products Inc. (B.C., Canada) Trendsetter® thermal plate setter at an energy output of 600 $mJ/cm^2$, wavelength of 830 nm and resolution of 2400 dpi. After exposure the plate is washed with warm water to remove the unexposed area and mounted on an offset press (Ryobi 520). Good print results were obtained using standard inks and fountain solution. Same coating was also tested manually by heating a test strip to about 150° C. for a few seconds and measuring the contact angles with water droplets. In the unheated area the contact angle was below 10° and in the heated areas it was about 90°. Further examination with an electronic microscope revealed that besides the chemical reaction there is also a small physical change in the surface. The unexposed surface has a more porous structure while the heated area show a slight evidence of melting. The slight melting can by no means explain the dramatic change in the contact angel, but it helps as the more porous surface has a higher surface area and therefore a higher surface energy.

Example 2A–2B

These examples are the same as example 1A–1B with the addition of 1 gram of polyvinyl butyral (14.3 grams of a 7% solution, material available from the Monsanto Corp., St. Louis, Mo., Type B72). Material is coated on non-lithographic aluminum, exposed under same conditions as in example 1A–1B and mounted on offset press without washing off the unexposed area. The unexposed areas are now hydrophilic but do not dissolve easily. Good print results achieved with conventional (acid) fountain solution as well as plain water fountain solution without the unexposed areas washing off. Print results of example 2B (ADS830 absorber) are better than 2A (carbon absorber) mainly due to difficulty of uniformly dispersing the carbon particles.

Example 3A–3B

These examples are the same as example 1A–1B, but the ratio of polyacrylic acid polymer to silver behenate is changed to increase solubility of the unexposed areas. The ratio is:

4 grams silver behenate 2 grams polyacrylic acid polymer 1 gram absorber 25 grams ethanol In this example the solubility of the unexposed area is greater than example 1A–1B, without significantly affecting the insolubility of the heated areas. The higher solubility enables the use of the press fountain solution to wash away the unheated areas, without requiring an intermediate step of washing. This allows the composition of example 3A–3B to be applied directly to a re-usable plate permanently mounted on press cylinder and imaging on press.

Example 4

This sample is prepared in same manner as example 1A–1B but without using any solvent except water.

3 grams silver behenate 4 grams 25% solution of polyacrylic acid in water, number average molecular weight of about 240,000 (Goodrich K702)

1 gram Zeneca WS830 water soluble dye (from Zeneca Specialty Chemicals, UK)

30 grams water

This can be used as in example 1A–1B or with modified solubility as in examples 2A–2B and 3A–3B. The no solvent, all waterborne process, is important for environmental considerations as well as cost savings since a water solution of polyacrylic acid is significantly lower in cost than purified acid.

Example 5

This example is the same as example 4 except that the sodium salt of polyacrylic acid (weight average molecular weight of about 5800) is used instead of polyacrylic acid. The results were also similar.

Example 6

This example was the same as examples 1A–1B and 2A–2B, with the addition of 0.1 gram of colloidal silica. Water receptivity and ease of coating are improved.

Example 7

This example is the same as examples 1A–1B and 2A–2B, with the addition of a small amount of 3M FC125 (a fluoroester stirfactant from 3M Corp., Minneapolis, Minn.). Water receptivity is improved by this addition. This example shows the ability to add surfactants and other modifiers without affecting the basic reaction.

Example 8

This example is he same as examples 1A–1B and 2A–2B, with the additions of a small amount of Triton® X100-100 surface active agent. Water receptivity is improved.

Example 9

This example is the same as examples 1A–1B except iron stearate is used instead of silver behenate. Reaction is similar but performance is lower, with hydrophobic properties not as robust as achieved in example 1A–1B.

Copper Salts

In addition to the use of silver salts as described above, copper salts and other silver salts, particularly copper or silver organic salts, and more particularly silver or copper salts of sulfamides such as sulfadianzine and sulfamerazine may be used.

ADDITIONAL EXAMPLES

Example 10

Silver sulfadiazine (Aldrich Chemical) was dispersed using 10 g silver sulfadiazine, 5 g zinc oxide and 7 g of 5% polyvinyl butyral (Solutia, Butvar® B72) solution in ethanol and 51 g of ethanol. This was ball milled for 18–24 hours to form a stable dispersion.

This dispersion was formulated into a coating by mixing 8 g of dispersion with 0.4 g of 5% acetic acid/water and 2.7 g of water and 8 g of ethanol. This was mixed quickly with 11.6 g of 7.5% ethanol solution and polyacrylic acid with 9.2 g of 2% ethanol solution of infrared absorbing die (830A from American Dye Source) and 56 g of ethanol. This coating was immediately coated and dried for three minutes in an over at 75 degrees Celsius to yield a coating weight of 3.0 g/m$^2$.

When this coated material was imaged with an infrared diode t 830 nm, the image areas turned hydrophobic, taking ink very well, while the non-imaged background stayed clean.

Example 11

Copper Sulfadiazine was prepared using sulfadiazine (Spectrum Chemical) with sodium hydroxide to make the sodium salt and precipitating copper sulfadiazine using copper nitrate. The copper sulfadiazine was dispersed in the same manner that the silver diazine was dispersed above and similarly coated. The resulting printing plate was able to be imaged at lower energies than was the silver sulfadiazine plate described directly above, and provided sharp images with clean backgrounds when urn on a printing press.

It is also preferred that the metal compound comprise a metal salt, such as compromising a metal salt of a sulfamide, such as where the metal salt is selected from the class consisting of metal salts of sulfamide, sulfanylamide, acetosulfamine, sulfapyridine, sulfaguanidine, sulfamethoxazole, sulfathiazole, sulfadiazine, sulfamerazine, sulfamethazine, sulfaisoxazole, homosulfamine, sulfisomidine, sulfaguanidine, sulfamethizole, sulfapyradine, phthalisosulfathiazole, and succinvylsulfathizole. The metal salts may also comprise any other metal organic salt (particularly light-insensitive salts such as light insensitive silver salts) such as metal salts of saccharides, thiocarboamates, benzthiazole, silver benzamidazole, etc., and other salts and complexed salts (e.g., U.S. Pat. No. 4,260,677, which is incorporated herein by reference for its disclosure on useful complexes of metal compounds) known to be thermally degradable as in photothermographic imaging systems.

Having described the present invention, with reference to those specified embodiments, it is understood that numerous variations can be made without departing from the spirit of the invention and it is intended to encompass such reasonable variations or equivalents within its scope.

What is claimed:

1. A negative working wet printing member imageable by laser radiation, said member comprising:

(a) a hydrophilic surface layer comprising one or more polymers and an absorber, said absorber being characterized by absorption of said laser radiation and said surface layer being characterized by non-ablative absorption of said laser radiation;

(b) a substrate underlying said surface layer;

wherein said surface layer comprises metal salts of organic acids, and poly(meth)acryloyl polymer binder.

2. The member of claim 1 wherein said metal of said metal salts comprises silver or copper.

3. The member of claim 2 wherein said polymer comprises polyacrylic acid.

4. The member of claim 2 wherein said metal salts comprises a salt of a sulfamide.

5. The member of claim 4 wherein said polymer comprises polyacrylic acid.

6. The member of claim 2 wherein said metal salts comprises a salt of a sulfadiazine.

7. The member of claim 6 wherein said polymer comprises polyacrylic acid.

8. A laser imaged lithographic printing master derived from the member of claim 1 comprising a substrate and a surface layer said substrate comprises a dimensionally stable substrate coated with a layer of the surface layer, the surface layer also containing an absorber for absorbing radiation of said laser.

9. The member of claim 1 wherein the metal salt is selected from the group consisting of metal salts of sulfamide, sulfanylamide, acetosulfamine, sulfapyridine, sulfaguanidine, sulfamethoxazole, sulfathiazole, sulfadiazine, sulfamerazine, sulfamethazine, sulfaisoxazole, homosulfamine, sulfisomidine, sulfaguanidine, sulfamethizole, sulfapyradine, phthalisosulfathiazole, and succinylsulfathiazole.

10. The member of claim 9 wherein the metal of the metal salt comprises silver or copper.

11. A process for forming a negative working wet printing member imageable by laser radiation, said member comprising:

a hydrophilic surface layer comprising one or more polymers and an absorber, said absorber being characterized by absorption of said laser radiation and said surface layer being characterized by non-ablative absorption of said laser radiation;

a substrate underlying said surface layer;

wherein the surface layer comprises metal salts of organic acids, polymer binder, and an acryloyl composition and the member is addressed by a laser to alter the properties of the surface layer.

12. The process of claim 11 wherein said metal of said metal salts comprises silver or copper.

13. The process of claim 12 wherein the surface layer also contains zinc oxide.

14. The process of claim 13 wherein the metal salt is selected from the group consisting of silver or copper salts of sulfamide, sulfanylamide, acetosulfamine, sulfapyridine, sulfaguanidine, sulfamethoxazole, sulfathiazole, sulfadiazine, sulfamerazine, sulfamethazine, sulfaisoxazole, homosulfamine, sulfisomidine, sulfaguanidine, sulfamethizole, sulfapyradine, phthalisosulfathiazole, and succinylsulfathiazole.

15. The process of claim 14 wherein the acryloyl composition comprises polyacrylic acid.

16. The process of claim 13 wherein the acryloyl composition comprises polyacrylic acid.

17. The process of claim 12 wherein the metal salts comprises a salt of a sulfamide.

18. The process of claim 12 wherein the metal salts comprises a salt of a sulfadiazine.

19. The process of claim 11 wherein the surface layer also contains zinc oxide.

20. A negative working wet printing member imageable by laser radiation, said member comprising:

(d) a hydrophilic surface layer comprising one or more polymers and an absorber, said absorber being characterized by absorption of said laser radiation and said surface layer being characterized by non-ablative absorption of said laser radiation;

(b) a substrate underlying said surface layer;

wherein said surface layer comprises metal salts of organic acids, polymer binder, and an acryloyl compound.

21. The member of claim 20 wherein said metal of said metal salts comprises silver or copper.

22. The member of claim 21 wherein said metal salts comprises a salt of a sulfamide.

23. The member of claim 22 wherein said sulfamide comprises sulfadiazine.

24. The member of claim 21 wherein acryloyl compound comprises polyacrylic acid.

25. The member of claim 20 wherein the acryloyl compound comprises an acid.

26. The member of claim 20 wherein the metal salt is selected from the group consisting of metal salts of sulfamide, sulfanylamide, acetosulfamine, sulfapyridine, sulfaguanidine, sulfamethoxazole, sulfathiazole, sulfadiazine, sulfamerazine, sulfamethazine, sulfaisoxazole, homosulfamine, sulfisomidine, sulfaguanidine, sulfamethizole, sulfapyradine, phthalisosulfathiazole, and succinylsulfathiazole.

27. The member of claim 26 wherein the metal of the metal salt comprises silver or copper.

* * * * *